United States Patent
Keil et al.

(10) Patent No.: US 6,610,459 B1
(45) Date of Patent: Aug. 26, 2003

(54) CONVEYORIZED VACUUM APPLICATOR AND METHOD OF APPLYING A DRY FILM RESIST TO A PRINTED CIRCUIT BOARD

(75) Inventors: Charles R. Keil, Foothill Ranch, CA (US); Osvaldo Novello, Albazzate (IT); Roberto Stanich, Milan (IT)

(73) Assignee: Shipley Company, L.L.C., Marlborough, MA (US)

( * ) Notice: Subject to any disclaimer, the term of this patent is extended or adjusted under 35 U.S.C. 154(b) by 220 days.

(21) Appl. No.: 09/648,428

(22) Filed: Aug. 25, 2000

(30) Foreign Application Priority Data

Aug. 25, 1999 (IT) .......................... MI99A1833

(51) Int. Cl.[7] ................................ G03F 7/16

(52) U.S. Cl. ................ 430/311; 430/319; 428/901

(58) Field of Search ................ 430/319, 311; 428/901

(56) References Cited

U.S. PATENT DOCUMENTS

| | | | | |
|---|---|---|---|---|
| 4,127,436 A | * | 11/1978 | Friel | 156/630 |
| 4,281,922 A | * | 8/1981 | Matsumoto | 355/99 |
| 4,659,419 A | * | 4/1987 | Miyake | 156/522 |
| 4,743,325 A | * | 5/1988 | Miyake | 156/250 |
| 4,889,790 A | | 12/1989 | Roos et al. | 439/258 |
| 4,927,733 A | * | 5/1990 | Stout | 430/256 |
| 4,946,524 A | | 8/1990 | Stumpf et al. | 156/87 |
| 4,992,354 A | | 2/1991 | Axon et al. | 430/258 |
| 5,164,284 A | | 11/1992 | Briguglio et al. | 430/258 |
| 5,292,388 A | | 3/1994 | Candore | 156/64 |
| 5,557,844 A | * | 9/1996 | Bhatt et al. | 29/852 |
| 5,863,447 A | * | 1/1999 | Coteus et al. | 216/17 |
| 6,041,840 A | * | 3/2000 | Ogawa | 156/382 |
| 6,104,475 A | * | 8/2000 | Cook et al. | 355/84 |

FOREIGN PATENT DOCUMENTS

| | | | |
|---|---|---|---|
| DE | 40 18 177 A | 12/1991 | |
| EP | 460 621 A1 | * 12/1991 | .......... B32B/31/10 |
| EP | 1 078 735 A2 | * 2/2001 | .......... B32B/31/20 |
| EP | 1 078 734 A2 | * 2/2002 | .......... B32B/31/20 |

(List continued on next page.)

OTHER PUBLICATIONS

Patent Abstracts of Japan; vol. 015, No. 433 (P–1271), Nov. 5, 1991 & JP 03 179449 A (Hakutou KK; Others: 01), Aug. 5, 1991 & Database WPI, Derwent Publications Ltd., London, kGB; AN 1991–271081 & JP 03 179449 A (Hakuto), Aug. 5, 1991, *abstract*.

Primary Examiner—Rosemary Ashton
Assistant Examiner—Barbara Gilliam
(74) Attorney, Agent, or Firm—John J. Piskorski

(57) ABSTRACT

An improved method of and apparatus that is continuously automatically operative in an in-line system is described for applying under vacuum, heat and mechanical pressure a dry film photoresist-forming layer to printed circuit boards (200) that already have been prelaminated by the loose application thereto of the dry film resist as discrete cut sheets within the confines of the surface of the boards whereby a laminate without entrapped air bubbles and closely conforming to the raised circuit traces and irregular surface contours of the printed circuit board is obtained. Featured is a conveyorized vacuum applicator (12) comprising two independent vacuum lamination chambers (18,20) in end-to-end relation. The first vacuum chamber operates at ambient temperature to draw off all of the air entrapped between the dry film resist and the surface of the printed circuit board at conditions that do not result in premature tacking of the dry film to the surface of the board. Then, in the second vacuum chamber, the photoresist-forming layer is immediately laminated to the printed circuit board under heat and mechanical pressure. The forgoing reduces or eliminates common lamination defects such as premature resist tacking and the attendant need to repair or rework the printed circuit board.

9 Claims, 11 Drawing Sheets

FOREIGN PATENT DOCUMENTS

| | | | | |
|---|---|---|---|---|
| JP | 2-226152 A | * | 9/1990 | ............. G03F/7/20 |
| JP | 3-179449 A | * | 5/1991 | ............. G03F/7/16 |
| JP | 4-39038 A | * | 2/1992 | ........... B32B/31/10 |
| JP | 2001-171005 A | * | 6/2001 | ........... B29C/65/02 |

* cited by examiner

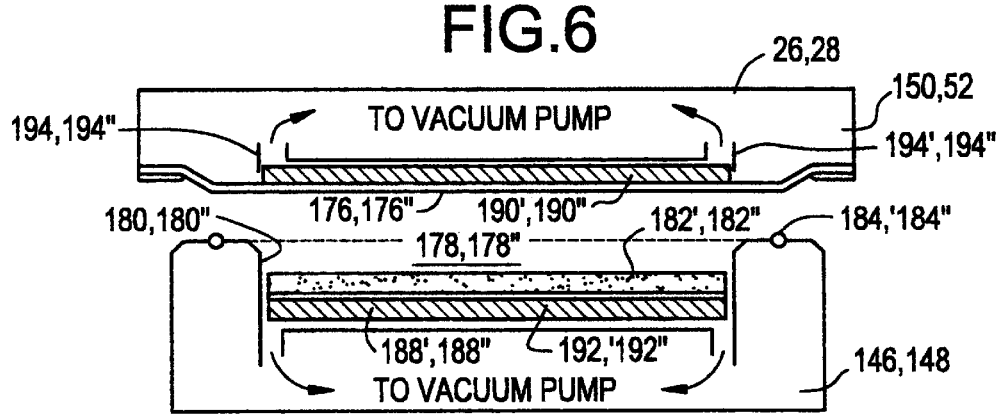
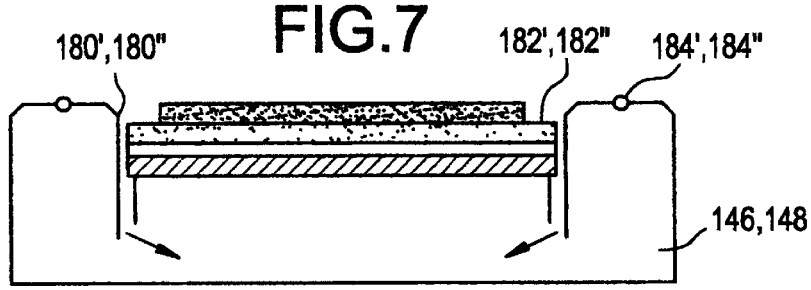
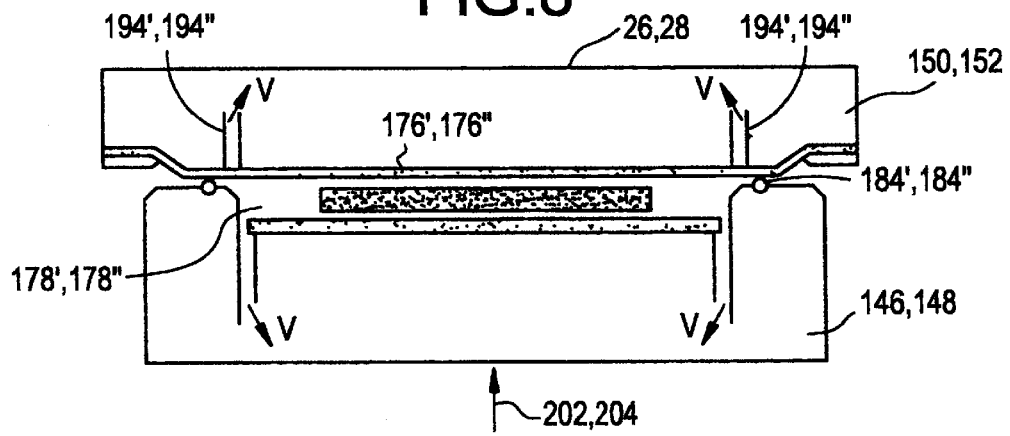
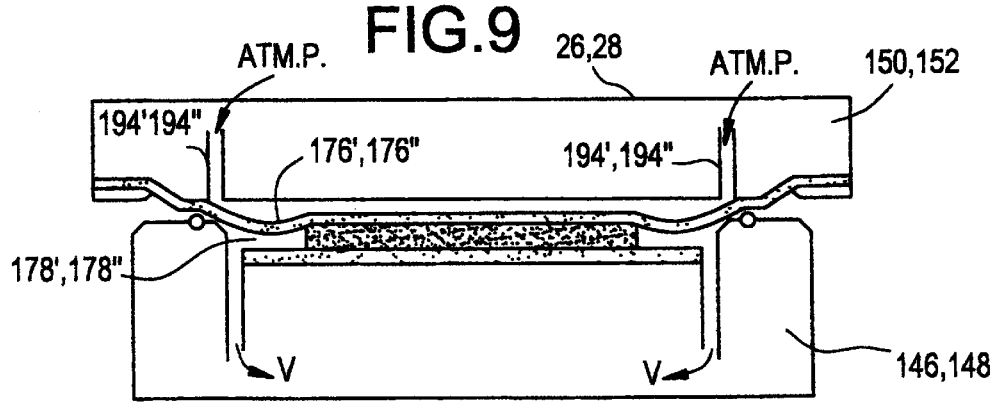

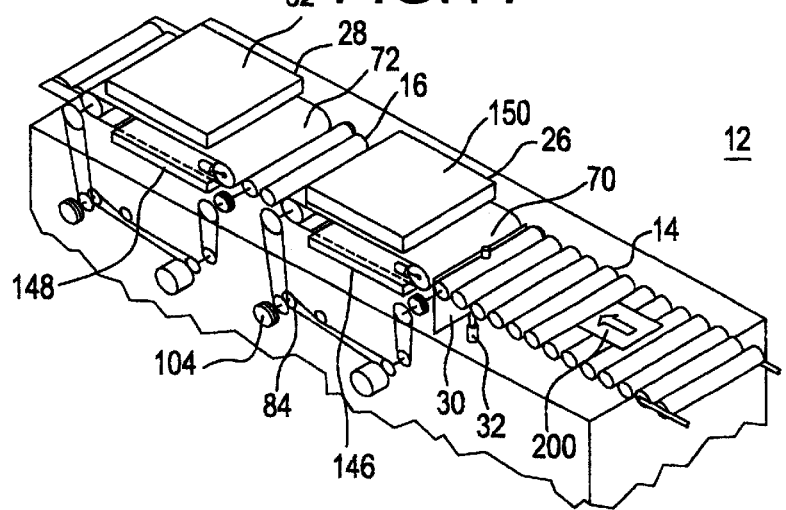
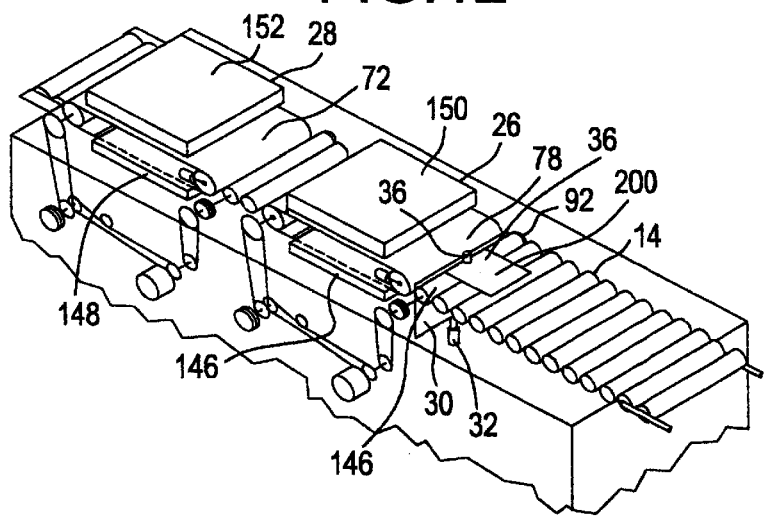
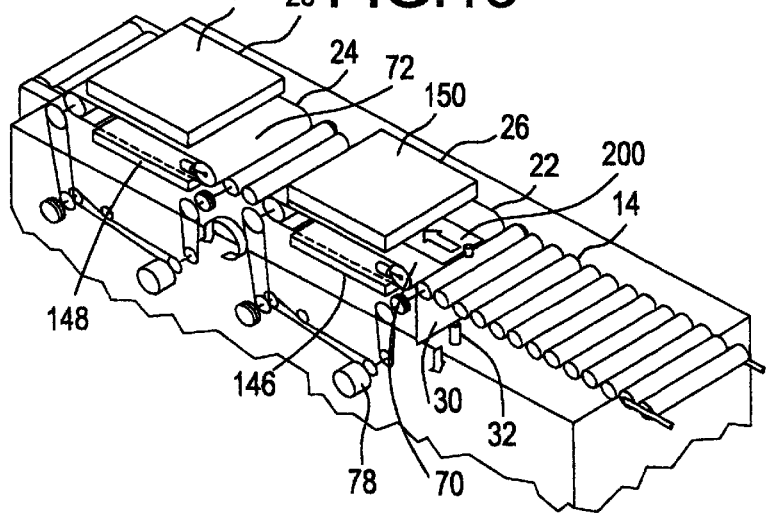

CONVEYORIZED VACUUM APPLICATOR AND METHOD OF APPLYING A DRY FILM RESIST TO A PRINTED CIRCUIT BOARD

The present invention is directed to an automatic conveyorized vacuum applicator and method of operation thereof having utility in the application of dry film photoresist-forming materials, such as photoresists and solder masks, to surfaces of printed circuit boards or other substrates, to assure complete conformance of the dry films around raised circuit traces and irregular surface contours. The applicator and method have particular utility for conveying and for applying vacuum, heat, and mechanical pressure to printed circuit boards or other substrates that prior to such application have had dry film loosely applied to at least one of the surfaces thereof as discrete cut sheets within the confines of the substrate.

Primary imaging photoresists and secondary imaging solder masks are among the most widely used photoimageable materials in the manufacture of printed circuit boards. A primary imaging photoresist is used in the creation of the printed circuitry itself, whereas a solder mask is used to protect the printed circuitry during soldering of components onto the board.

A primary photoresist is a hard, temporary layer of non-conductive material which covers the metal surface of a copper-clad substrate that later becomes the printed circuit board. The photoresist is patterned in such a way so as to produce a resist stencil around which the printed circuit tracks are formed.

More specifically, primary photoresists, typically, are formed from a layer of photoimageable composition which is applied to the surface of a copper-clad board. The photoimageable composition is exposed to actinic radiation which is patterned by means of a template or artwork. Subsequent to exposure, the photoimageable layer is developed in an organic solvent, aqueous, or semi-aqueous solution which washes away either exposed or unexposed portions of the layer (depending on whether the photoimageable material is positive-acting or negative-acting). Thereafter, the circuit traces are formed by either electroplating or etching. In a typical plating procedure, the areas devoid of photoresist that become the circuitry are built up from the board surface by electroplating copper thereon. After protecting the electroplated copper layer, the remaining photoresist is stripped away in an organic solvent, aqueous, or semi-aqueous solution, and the newly exposed areas of metal are then selectively removed in an etching solution, leaving behind the pattern plated copper circuit lines. In a typical etching procedure, the metal in the areas devoid of photoresist is selectively removed in an etching solution, leaving behind the residual portions of the etched metal layer as the circuit traces after the primary resist is stripped away.

A solder mask, on the.other hand, is a hard, permanent layer of non-conductive material which covers the surface of a printed circuit board or other substrate, encapsulating the traces of the printed circuitry itself. The solder mask is patterned to fully cover the circuitry, except for those portions intended to be exposed, e.g., for soldering to another component.

More specifically, solder masks, typically, are formed from a layer of photoimageable composition which is applied to a surface of the printed circuit board. Similar to primary imaging resists, the photoimageable layer is exposed to actinic radiation which is patterned by means of a template or artwork. Subsequent to exposure, the photoimageable layer is developed in an organic solvent, aqueous, or semi-aqueous solution which washes away either exposed or unexposed portions of the layer (again depending upon whether the photoimageable material is positive-acting or negative-acting). The portion of the layer which remains on the surface is then cured, e.g., with heat and/or UV light, to form a hard, permanent solder mask intended to protect the printed circuitry for the life of the board.

One prior art method of applying a layer of primary resist or solder mask to a circuit board surface is to apply the material in liquid form, and then, either allow it to dry or partially cure the material to form a semi-stable layer. There are a number of advantages, however, to applying a photoimageable layer to a circuit board as a dry film rather than as a liquid. In particular, dry films are free of organic solvent and therefore eliminate this hazard from the workplace and eliminate the need for apparatus to protect the immediate work environment and the more general environment from organic solvent emissions.

Typically, such a dry film comprises a cover sheet of support material which is somewhat flexible but which has sufficient rigidity to provide structure to a layer of photoimageable composition which overlies one surface of the cover sheet. The cover sheet may be formed of polyester material, such a polyethylene terephthalate (PET). To protect the photoimageable layer and to enable the dry film to be rolled, it is conventional for the exposed surface of the photoimageable layer to be covered with a removable protective sheet, e.g., a sheet of polyethylene.

The method of use of such a dry film is generally as follows. The protective polyethylene sheet is removed from the photoimageable composition layer immediately prior to application of the dry film to the surface of the printed circuit board. This may be accomplished, for example, using automated apparatus which peels away and rolls up the protective sheet as the dry film is unrolled from a reel. The dry film is applied to the surface of the circuit board with the photoimageable layer in direct contact with the board surface. Then using either heat and mechanical pressure (in the case of roll laminators) or a combination of vacuum, heat, and mechanical pressure (in the case of vacuum laminators), the photoimageable layer is immediately laminated to the surface of the board. The cover sheet remains overlying the photoimageable layer, protecting the photoimageable layer from exposure to oxygen and from handling damage. The cover sheet also permits a pattern (or template) to be laid directly on top of the dry film for contact printing, if contact printing is to be used (as is usually preferred from the standpoint of obtaining optimal image resolution). The dry film is exposed to patterned actinic radiation through the PET cover sheet. At this time, the PET cover sheet is removed, permitting access to the exposed photoimageable layer by developer. Depending upon the composition of the photoimageable layer, the photoimageable layer is developed with organic solvent, aqueous developer, or semi-aqueous developer. The photoimageable layer may either be positive-acting, in which case the exposed portions are removed by developer, or negative-acting, in which case the unexposed portions are removed by developer. Most photoimageable layers for preparing primary imaging photoresists and solder masks are negative-acting. Subsequent to development, primary resists, in particular, are subjected to either electroplating or etching, as previously described, to form the circuit traces after which the remaining photoresist is stripped away with organic solvent, aqueous stripper, or semi-aqueous stripper. Whereas, in the case of solder masks which remain on the board permanently, most photoimageable composition layers require some cure subsequent to development to render the layer hard and permanent so as to serve as a solder mask. Depending upon the composition of the photoimageable layer, curing may be effected with heat and/or UV light.

Printed circuit boards almost invariably have uneven surfaces which present difficulties for dry film application. During solder mask application, in particular, such unevenness is usually attributed to the circuitry traces which are raised or elevated over the surface of the board of electrically non-conducting material. It is therefore desirable that any dry film solder mask applied to the board be able to conform around the upstanding circuitry traces to minimize the risk of defects, such as short circuits. On the other hand, during primary resist application, such unevenness usually arises when creating circuitry on thin outer surfaces of multi-layered circuit boards which contain embedded components that protrude and leave impressions on the outer surface. It is desirable that any photoresist applied to such a board be able to conform to such irregular surface contours to minimize the formation of defects, such as voids, disconnects, or shorts. There has also been a demand on circuit board manufactures, due to the current trend to miniaturize electronic equipment, to reduce the size of printed circuit boards while increasing their functional capabilities which presents other difficulties for dry film photoresist application. As more circuitry needs to be fit onto smaller surfaces, the circuit lines and spaces therebetween on the circuit board have continued to shrink. The creation of this fine line and closely spaced circuitry can be achieved only with difficulty and only if the primary resist fully adheres and completely conforms to the contours of the printed circuit board. Otherwise, voiding of the minute circuit traces and creation of disconnects or shorts will occur.

A number of improved photoimageable dry films and vacuum lamination processes have been developed to try to improve the conformance of the dry film to the irregular surface contours of a printed circuit board, as for example, as disclosed in U.S. Pat. No. 4,889,790 (Roos et al.), U.S. Pat. No. 4,992,354 (Axon et al.), and U.S. Pat. No. 5,164,284 (Briguglio et al.), The processes disclosed in these patents involve applying a photoresist-forming layer to a printed circuit board using a dry film in which an "intermediate layer" selected for its transparency, strength and flexibility is interposed between the support film or cover sheet and the photoimageable layer. The intermediate layer of the dry film is selectively more adherent to the photoimageable composition layer than to the cover sheet, allowing the cover sheet to be removed after the photoimageable layer is laminated to a printed circuit board to assist conformance, with the intermediate layer remaining on the photoimageable composition layer as a "top coat." The top coat is of non-tacky material and can be placed in contact with other surfaces, such as artwork for contact printing. The top coat also serves as an oxygen barrier, allowing the photoimageable composition layer to remain unexposed on the printed circuit board, after cover sheet removal, for some length of time. The use of dry film having the "intermediate layer" or "top coat" make possible the processes described in these patents.

In each case, to form a more conforming dry film, the protective polyethylene sheet is first peeled away and the exposed surface of the photoimageable composition layer is applied to the surface of the printed circuit board. Using vacuum, heat and mechanical pressure, the dry film is laminated to the surface of the printed circuit board, partially conforming the photoimageable layer thereto. Within about 60 seconds and before substantial cooling of the printed circuit board and dry film has occurred, the cover sheet of the dry film is removed, whereupon the photoimageable composition layer and overlying top coat fully conform to the contours of the printed circuit board and substantially encapsulate the traces and surface contours before conventional processing. Because the cover sheet is removed prior to the final conforming step, better conformance, particularly when applying thin photoimageable composition layers onto boards with closely spaced traces, is achieved. Better resolution is also achievable because the top coat may be directly contacted with artwork for contact printing and because the top coat is much thinner than a cover sheet or support film and is, therefore, much less a deterrent to good resolution than a support film.

In U.S. Pat. No. 4,946,524 (Stumpf et al.), there is disclosed an applicator and process for applying a conforming dry film material to the surface of a printed circuit board allowing for, at the same time, the removal of the protective sheet, subsequent handling of the board with the applied film, and the draw-off of air enclosed between the film and the board. The draw-off of air enclosed between the dry film and the surface of the printed circuit board is facilitated when, before vacuum lamination, the surface of the board is covered with a loose sheet of film. To that end the applicator of U.S. Pat. No. 4,946,524 is operative to tack the dry film to a board at the leading and trailing edges with the intermediate portion of the film loosely applied thereto. The film is tacked to the board as a discrete cut sheet within the confines of the perimeter of the surface of the board. For convenience, a printed circuit board having such loose application of a dry film sheet to the surface or surfaces thereof is referred to hereinafter as being "prelaminated."

In order to adapt the processes described in the preceding patents for continuous automatic operation in an in-line system, there is disclosed in U.S. Pat. No. 5,292,388 (Candore) an automatic conveyorized vacuum laminator apparatus. The apparatus of U.S. Pat. No. 5,292,388 provides an improved and efficient means for automatically conveying and applying vacuum, heat, and mechanical pressure to prelaminated printed circuit boards or substrates and overcomes the difficulties encountered with the utilization of a conventional batch vacuum laminator in an automated in-line system. The automatic conveyorized vacuum laminator is comprised of two main parts, a vacuum laminator and an input roll conveyor for feeding prelaminated circuit boards into the vacuum laminator from the preceding prelaminating equipment. The vacuum laminator, in particular, comprises a single vacuum chamber defined by heated upper and lower platens, and an endless belt conveyor disposed between the platens for movement of the printed circuit boards into and out of the vacuum chamber region. In operation, the prelaminated circuit board (i.e., having the dry film photoimageable material loosely applied to its surface) to be vacuum laminated is transferred from the input roll conveyor to the endless belt which moves the board into proper vacuum lamination position between the heated upper and lower platens. Thereafter, the lower platen is raised into sealing engagement with the upper platen in order to capture in the vacuum chamber the endless belt conveyor and the prelaminated board resting on the endless belt. Next, a vacuum is drawn in the vacuum chamber between the platens to evacuate all air between the dry film and surface of the prelaminated board, followed by application of heat and mechanical pressure to conform the dry film to the board. When the cycle is complete, the lower platen is lowered and the laminated board in conveyed away to subsequent processing equipment, while the next board to be vacuum laminated arrives for the next vacuum lamination cycle.

Difficulty has been encountered, however, with the operation of such a conveyorized vacuum lamination apparatus, as described in U.S. Pat. No. 5,292,388. Particularly, premature tacking of the dry film to the board surface prior to chamber evacuation has been a problem. The problem is particularly prevalent with thin boards (e.g. <0.25 mm.), since they are susceptible to rapid heating. In order to assure complete conformance of the dry film around the circuit traces and substrate surface contours, it is necessary that the loose sheet of dry film prelaminated to the board allow for all air enclosed between it and surface of the printed circuit board to be evacuated before applying heat and mechanical pressure to conform the film to the board. Yet, with the above apparatus, the residual heat given off by the belt conveyor just after having completed a prior vacuum lamination cycle has a tendency to cause premature tacking of the film on the next board entering into the vacuum chamber prior to commencement of the vacuum lamination cycle. Premature adhesion prevents air from escaping from certain areas during vacuum lamination, which, in turn, prevents film conformance. In the case of solder masks, lack of film conformance results in lamination defects, such as unwanted puddling caused by premature adhesion. In the case of primary resists, lack of film conformance tends to result in voiding of entire portions of the circuit traces caused by incomplete adhesion, as well as puddling as previously described. The present invention was devised to address this problem.

While there has been some attempt to address this premature tacking problem, a satisfactory answer has yet to be devised. For instance, it has been proposed to process the dry films in conventional batch-oriented vacuum laminating equipment outfitted with removable copper heat shields between the upper and lower platens. The removable heat shields are manually inserted between the upper and lower platens immediately before placement of the board in the vacuum chamber. Evacuation is then commenced with the heat shields serving to insulate the resist from elevated temperatures long enough to be able to remove all of the air between the resist and the board before application of heat and mechanical pressure. However, batchwise processing is highly undesirable because it is entirely too slow for mass production of printed circuit boards and extremely labor intensive.

An object of the invention is, therefore, to provide an improved method of and apparatus for applying under vacuum, heat and mechanical pressure a dry film photoresist or solder mask to prelaminated printed circuit boards or other substrates, thereby to remove all of the air entrapped between the dry film and the surface of the printed circuit board or substrate to assure complete conformance of the dry film around the raised circuit traces and the substrate surface contours.

Another object of the invention is to provide an improved method of and apparatus for vacuum laminating prelaminated printed circuit boards and substrates, which method and apparatus prevent premature tacking of the loosely applied prelaminated dry film to the surface of the printed circuit board or substrate prior to evacuation of all of the air between the dry film and the board or substrate surface.

Still another object of the invention is to provide an improved method of and apparatus for vacuum laminating prelaminated printed circuit boards and substrates which are both operable in an in-line system and in a fully automated continuous manner.

In accomplishing the forgoing and other objectives of the invention, there is provided an improved method of laminating a prelaminated printed circuit board or other substrate which prevents premature tacking of the dry film photoresist-forming layer to the board comprising the following key features: (a) placing the board in a first vacuum lamination chamber of a vacuum laminator having two independent. (i.e., dual) vacuum lamination chambers; (b) drawing a vacuum in the first chamber at ambient temperature for a time sufficient to evacuate substantially all of the air from between the dry film and the surface of the board or substrate and thereby place the dry film in intimate contact with the surface of the board or substrate; (c) immediately placing the board in a second independent vacuum lamination chamber of the vacuum laminator; and, (d) applying sufficient heat to the dry film on the board or substrate in a second vacuum lamination chamber to cause the dry film to flow and then sufficient mechanical pressure on the board or substrate to thereby force the heated laminate to conform closely to the surface contours of the board or substrate.

The aforesaid steps (a)–(d) are preferably performed in-line and in a continuous automated manner, so that the method can be adapted for use in an fully automated in-line system for manufacturing printed circuit boards.

Steps (b) and (d) are also preferably performed in alternating sequence to allow for at least one prelaminated board to be in each vacuum chamber at the same time which, in turn, provides for at least a two-fold increase in manufacturing productivity.

In accomplishing these and other objectives of the invention, there is also provided an improved dry film photoresist or solder mask vacuum lamination apparatus comprising the following key features: the provision of two independent (i.e., dual) vacuum lamination chambers in end-to-end relation, the first lamination chamber being operated at ambient temperature while a vacuum is drawn so as to reduce the air pressure within the chamber and draw off all of the air between the loosely applied prelaminated dry film and the surface of the printed circuit board or substrate, thereby to place the dry film in intimate contact with the substrate surface while at the same time preventing premature tacking or adhesion of the dry film to the substrate prior to conforming lamination, and the second lamination chamber being operated immediately after the first chamber so as to laminate the previously evacuated dry film to the printed circuit board or substrate under heat and mechanical pressure, thereby to assure complete conformance of the dry film around the raised circuit traces and the substrate surface contours.

The aforesaid apparatus is preferably further characterized by the capacity thereof for continuous operation and the provision of conveyor belts for conveying prelaminated printed circuit boards or substrates into and out of the first and second vacuum lamination chambers of the vacuum applicator. It is also preferable to provide such a continuously operative conveyorized vacuum applicator that is operative, in association with automated input roll conveyors for feeding prelaminated printed circuit boards or substrates onto the automated conveyor belts, in such a way as to allow at least one board or substrate to be in each vacuum chamber of the vacuum laminator, while the next board or substrate to be vacuum laminated is staged in position on an input roll conveyor ready for the next vacuum lamination cycle to begin. Upon completion of the vacuum lamination cycle in each chamber, the printed circuit board in the second vacuum chamber is automatically conveyed out of the vacuum laminator, the board in the first vacuum chamber is conveyed to the second vacuum chamber, and the staged new printed circuit board to be vacuum laminated is conveyed into the first vacuum chamber.

The automatic conveyorized vacuum applicator has particular utility in conveying printed circuit boards and applying heat, vacuum and mechanical pressure to printed circuit boards that have been prelaminated with photoresist or solder mask dry film in accordance with the process described in U.S. Pat. No. 4,946,524 and fabricated in accordance with processes described in U.S. Pat. Nos. 4,889,790, 4,992,354, and 5,164,284.

The conveyorized dry film photoresist or solder mask applicator of the invention is an important component in the total arrangement of an automatic continuous flow of material in in-line processing of dry photoresist or solder mask films requiring vacuum lamination during processing.

The invention provides the means to automate the vacuum application process as an in-line system, while at the same time 1) reducing common lamination defects, such as premature resist adhesion, 2) substantially eliminating the need to repair or rework finished printed circuit boards, and 3) increasing printed circuit board manufacturing productivity by at least two-fold.

With this description of the invention, a detailed description follows with reference being made to the accompanying figures of drawing which form part of the specification in which like parts are designated by the same reference numbers and of which:

FIGS. 6–9 are cross sectional views of a vacuum laminator that advantageously may be used with the conveyorized vacuum applicator and which illustrate a platen operation sequence thereof;

Figure 1:
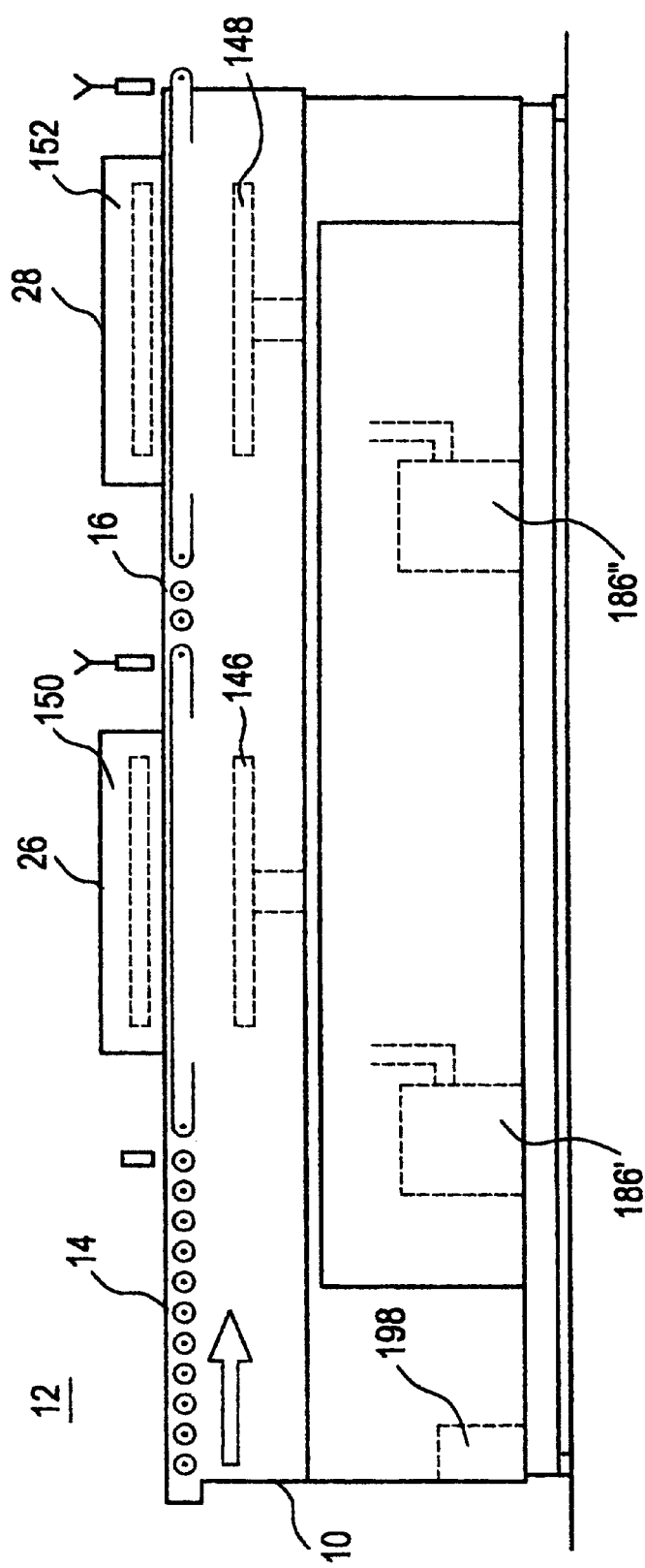
FIG. 1 is a side view of a cabinet structure in which the conveyorized dual chamber vacuum applicator of the present invention is housed.
Figure 2:
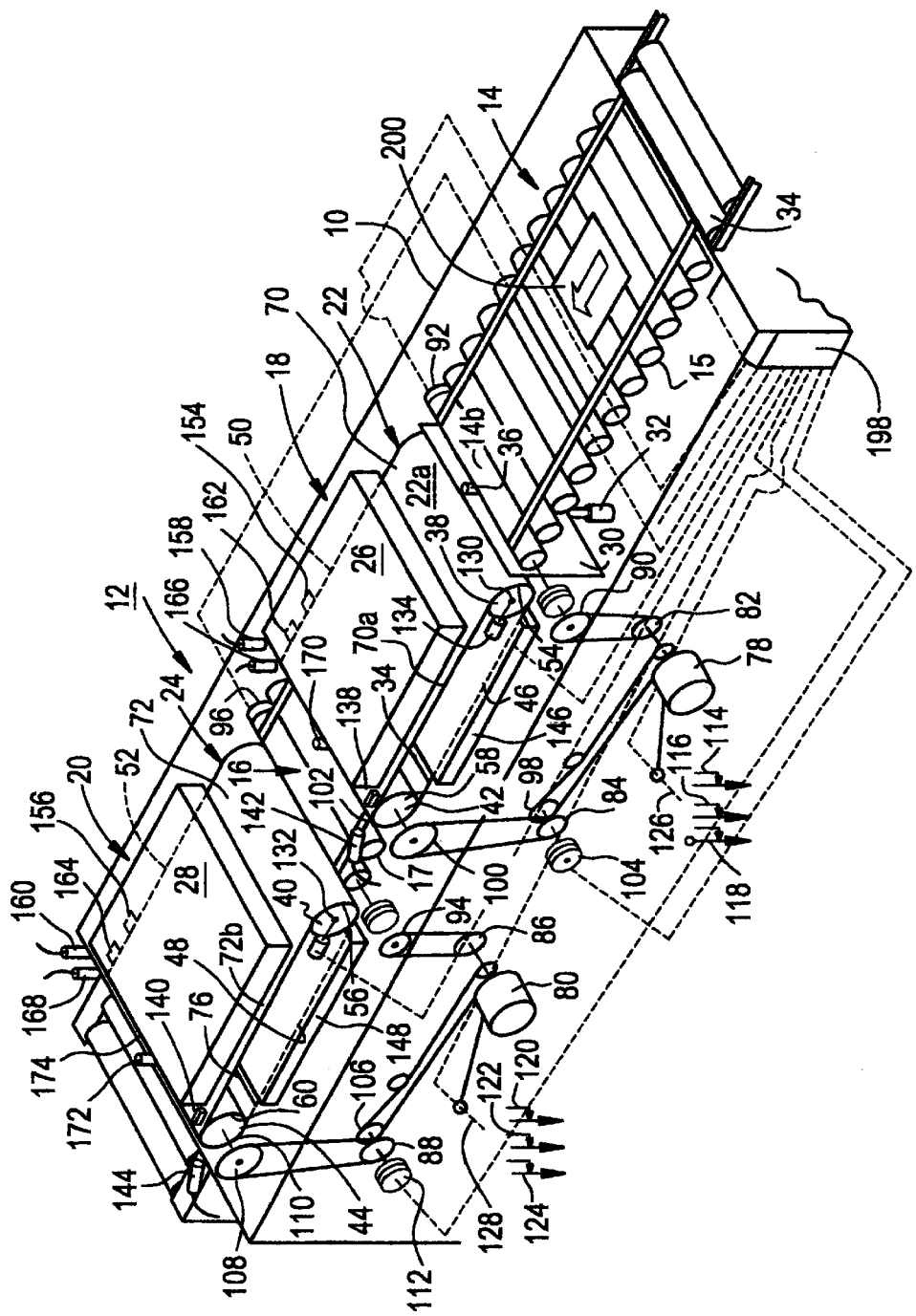
FIG. 2 is a diagrammatic perspective view on a scale larger than of FIG. 1 illustrating the conveyor system of the conveyorized vacuum applicator for sequentially feeding prelaminated printed circuit boards or substrates through the vacuum laminator.
Figure 24:
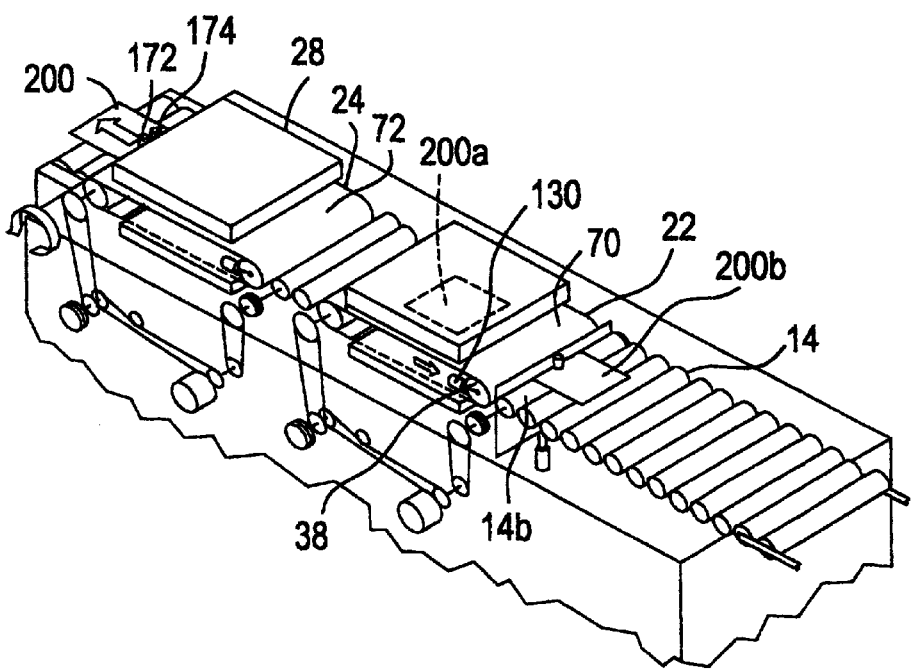
Figure 25:
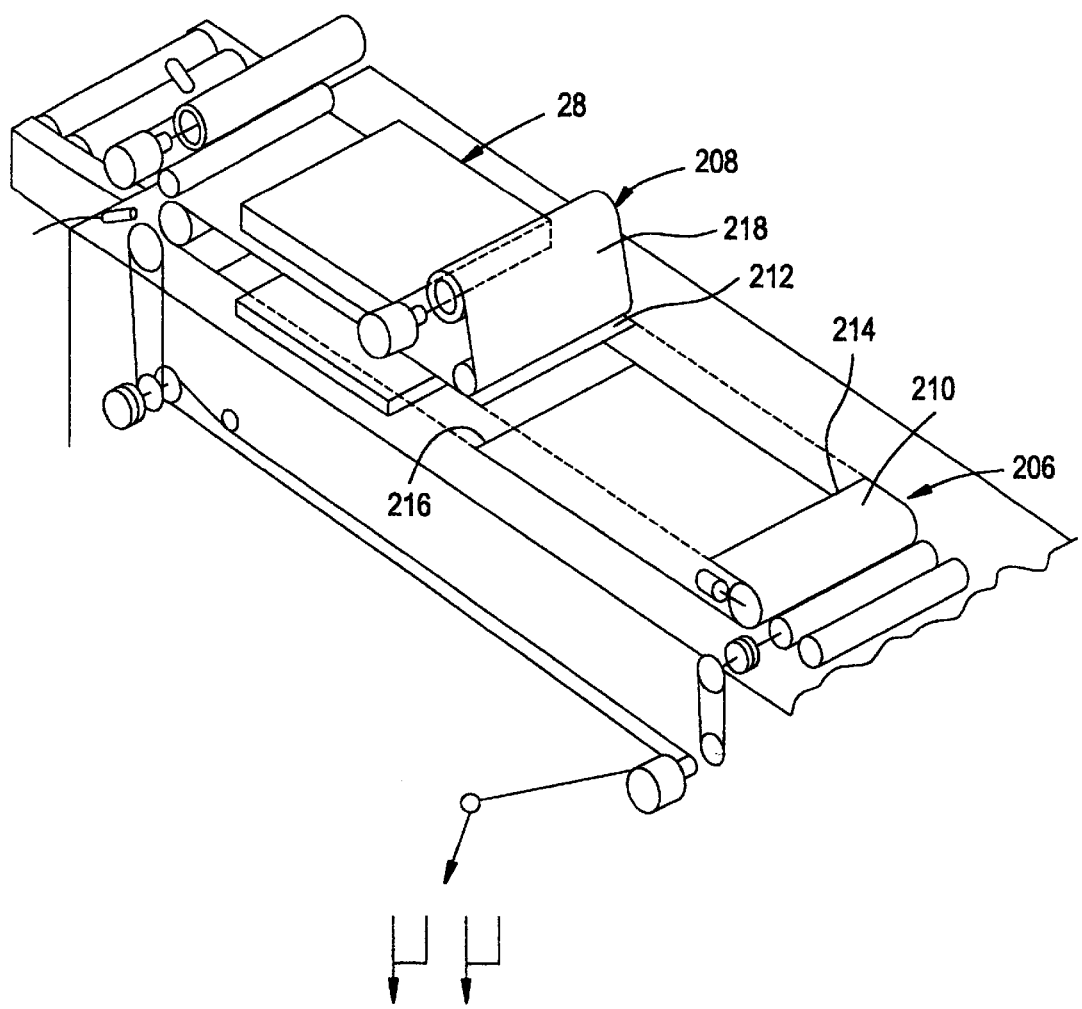

FIGS. 11–24 are diagrammatic perspective views on a smaller scale than shown in FIG. 2 that illustrate the function cycle of the conveyorized vacuum applicator when employed to feed printed circuit boards or substrates one at a time through the vacuum laminator; and, FIG. 25 is a diagrammatic perspective view of an alternative second chamber that may be employed in the conveyorized vacuum applicator of FIG. 1.

The conveyorized vacuum applicator according to the present invention has particular utility in the vacuum lamination of printed circuit boards and substrates of varying thicknesses and sizes, typically in a range from between 0.1 and 3.2 mm. and in a range from between 25×38 and 60×71 cm., which boards or substrates have been "prelaminated" with a loose sheet of dry film primary photoresist or solder mask, with or without a "top coat" layer, as hereinbefore described. The specific function of the conveyorized vacuum applicator is to automatically apply a combination of vacuum, heat and mechanical pressure in such way so as to avoid premature tacking and thus completely remove all of the air between the dry film and the surface of the board or substrate to assure positive conformance of the dry film around etched or electroplated circuit traces and irregular substrate surface contours.

Referring to FIGS. 1 and 2 there is shown a support structure or frame 10 on which is mounted the conveyorized vacuum applicator, designated 12, according to the invention. The conveyorized vacuum applicator 12 is comprised of two parts. One part comprises first and second input or feed conveyors 14 and 16. The other part comprises first and second vacuum lamination sections 18 and 20. Each of the first and second vacuum lamination sections 18 and 20 include a first and second ¾ belt conveyor 22 and 24 and a first and second vacuum laminator 26 and 28, respectively.

As shown in FIG. 2, the first input conveyor 14, first ¾ belt conveyor 22, second input conveyor 16, and second ¾ belt conveyor 24 extend in end-to-end relation, in that order, to define a continuous 18 path into and out of each vacuum section 18 and 20.

Each of the first and second input conveyors 14 and 16 comprise a plurality of chain coupled rolls 15 and 17, respectively, which rolls 15 and 17 extend for a substantial distance across the width of the applicator 12. Positioned for vertical movement between the exit end 14b of the first input conveyor 14 and the entrance end 22a of the first ¾ belt conveyor 22 is an adjustable barrier 30. The barrier 30 extends across the width of the applicator 12 and is movable upwardly by an individually associated air cylinder 32, as shown in FIG. 2. Such movement is from a "down" or non-blocking position to an "up" position to block the transport to the first ¾ belt conveyor 22 of a printed circuit board being transported on the first input conveyor 14 from preceding equipment indicated at 34.

As seen in FIG. 2, a photocell 36 is provided for sensing the approach of a printed circuit board to the exit end 14b of the input conveyor 14 and for initiating the actuation of the air cylinder 32 for effecting the movement of the barrier 30 between the printed circuit board non-blocking and blocking positions thereof.

Each of the ¾ belt conveyors 22 and 24 includes an input roll 38 and 40 and an output roll 42 and 44, respectively, which rolls extend across the width of the applicator 12. Wound around each pair of cooperating input and output rolls are a pair of spaced endless chains, with the spacing being such that one of each pair of chains 46 and 48 is on one side of applicator 12 and the other of each pair of chains 50 and 52 is on the other side thereof. Chains 46 and 48 mesh with individual gears 54 and 56, respectively, provided on the end of each corresponding input roll 38 and 40, and gears 58 and 60 provided on the end of each corresponding output roll 42 and 44, as shown in FIG. 2. Similarly chains 50 and 52 mesh with gears provided on the other ends of each corresponding input rolls 38 and 40 and output rolls 42 and 44. Thus, as shown in FIG. 3, chains 50 and 52 mesh with gears 62 and 64, respectively, on the end of the output rolls 42 and 44.

Figure 3:
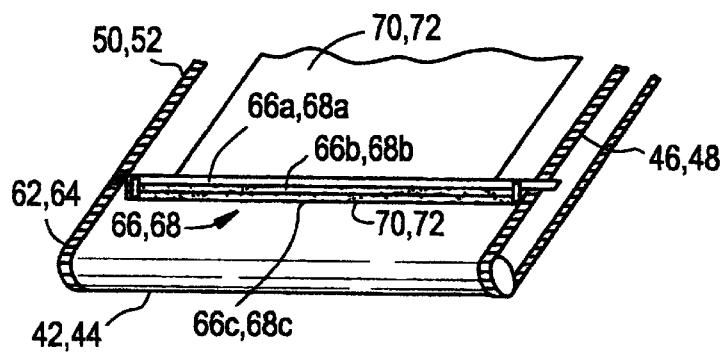
FIGS. 3–5 and 10 are fragmented detail views which illustrate various features of the applicator of FIGS. 1 and 2.

Positioned between each associated pair of chains 46, 50 and 48, 52 and securely attached thereto at each end by suitable grippers 66 and 68, as shown in FIG. 3, are respective belts 70 and 72 that each extend about three quarters of the distance around the loop formed by the chains. Each gripper 66 and 68 includes a respective bar 66a and 68a that is securely attached at one end to chain 46 and 48 and at the other end to the chain 50 and 52, respectively. Carried by each of the bars 66a and 68b and securely attached thereto by suitable bolts or rivets are respective bar members 66b and 68b and 66c and 68c of shorter length between which the ends of the respective belts 70 and 72 are captured and retained. Thus, as best seen in FIG. 2, each of the belts 70 and 72 have an associated aperture or opening 74 and 76 therein for the full width thereof, the length of which aperture 74 and 76 is about a quarter of the distance around the loop of each individually associated belt conveyor 22 and 24.

Each of the belts 70 and 72 may be made of very thin fiberglass reinforced rubber or Teflon coated fiberglass. A total thickness of the belt in the range of 0.013 to 0.025 cm. is desirable to ensure that there is a complete seal when drawing a vacuum in each vacuum laminator 26 and 28. This is for the reason that the upper run 70a and 72a of each belt 70 and 72 is captured between the upper and lower platens of each vacuum laminator 26 and 28 during the vacuum lamination process.

Motive power for driving the chain coupled rolls of the first input conveyor 14 and the first ¾ belt conveyor 22 associated therewith is provided by a first electrical motor 78. Motive power for driving the chain coupled rolls of the second input conveyor 16 and the second ¾ belt conveyor 22 associated therewith is provided by a second electrical motor 80. Motors 78 and 80 may each comprise a direct current electrical motor provided with separate drive gears 82 and 84 and 86 and 88, respectively, for driving their respective input conveyors 14 and 16 and belt conveyors 22 and 24.

As shown in FIG. 2, motor 78 is coupled by gear 82 and chain drive gearing 90 to the first input conveyor 14. Selective or conjoint drive of the input conveyor 14 is provided by electromagnetic clutch 92. Motor 80 is coupled by gear 86 and chain drive gearing 94 to the second input conveyor 16. Selective or conjoint drive of the input conveyor 16 with the other conveyors is provided by electromagnetic clutch 96. Energization and deenergization of clutch 92 controls the rotation of the chain coupled rolls of the first input conveyor 14. Similarly, energization and deenergization of clutch 96 controls the rotation of the chain coupled rolls of the second input conveyor 16.

Motor 78 is also coupled by gear 84 and chain drive gearing 98 and 100 to the drive shaft 102 of the output roll 42 of the first ¾ belt conveyor 22. An electromagnetic clutch 104 positioned between chain drive gearing 100 and 102 provides for the selective control of the operation of the first ¾ belt conveyor 22. Motor 80 is similarly coupled by gear 86 and chain drive gearing 106 and 108 to the drive shaft 110 of the output roll 44 of the second ¾ belt conveyor 24. Similarly, an electromagnetic clutch 112 positioned between the chain drive gearing 108 and 110 provides for selective control of the operation of the second ¾ belt conveyor 24.

In accordance with the invention, each of the motors 78 and 80 are a variable speed motor, being selective energizable from a source of direct current (not shown) through motor speed control potentiometers 114, 116 and 118 and 120, 122 and 124, respectively, and corresponding selector switches 126 and 128, as shown in FIG. 2, to drive the input conveyors 14 and 16 at the speed of about three (3) meters/minute (m/min), to drive the input conveyors 14 and 16 and ¾ belt conveyors 22 and 24 at a speed of about nine (9) m/min, and to drive the ¾ belt conveyors 22 and 24 only at a speed of 30 m/min, as further described hereinafter. The arrangement is such that the input conveyors 14 and 16 can be driven independently of each other and of the ¾ belt conveyors 22 and 24. Similarly, the ¾ belt conveyors 22 and 24 can be driven independently of each of the input conveyors 14 and 16. At no time, however, when driven at the same time, can the speeds of the conveyors 14, 16, 22 and 24 be different.

For the purpose of enabling the tension of the ¾ belts 70 and 72 of the first and second ¾ belt conveyors 22 and 24 to be relieved at a desired point in the vacuum process, as shown in FIG. 2, bearings 130 and 132 in which the shaft of the input rolls 38 and 40 of each of the ¾ belt conveyors 22 and 24 are mounted for rotation are arranged to be shifted a short distance toward and away from the corresponding vacuum laminator 26 and 28 by a respective two-position air cylinder 134 and 136.

Figure 4:
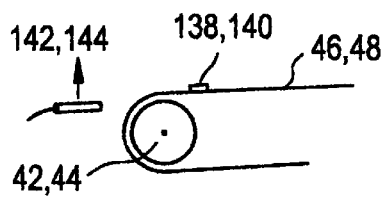

For sensing when a prelaminated printed circuit board has been moved by the belt conveyors 22 and 24 to a proper position relative to its individually associated vacuum laminator 26 and 28 for the vacuum lamination process to proceed, there are provided, as best seen in FIGS. 2 and 4, respective cams 138 and 140 and cooperating sensors 142 and 144. Cams 138 and 140 are mounted on and move respectively with their corresponding endless chains 46 and 48 around the loop of each of the individually associated belt conveyors 22 and 24. Corresponding sensors 142 and 144 are mounted in any suitable manner on the frame 10 of the applicator 12 in cooperative relation with their respective cams 138 and 140.

When the printed circuit board is in the proper position relative to the intended vacuum laminator 26 and 28 for the vacuum lamination process to proceed, the aperture 74 and 76 in the belt 70 and 72 of the belt conveyors 22 and 24 is positioned immediately, that is, vertically, below the vacuum laminator, as best seen in FIG. 2. This allows the lower platens 146 and 148 of respective first and second vacuum laminators 26 and 28 to be lifted up through the aperture 74 and 76 in each of the belts 70 and 72 into cooperative relation with the upper platens 150 and 152 of the respective vacuum laminators 26 and 28 for effecting the vacuum lamination of a printed circuit board then resting on the surface of the upper runs 70a and 72b of the belts 70 and 72 within the confines of the first and second vacuum laminators 26 and 28, respectively.

There is an initial position for each of the first and second belt conveyors 22 and 24 such that upon the transfer of a printed circuit board from either the first or second input conveyors 14 and 16, the printed circuit board will be moved within the laminating region of the respective vacuum laminator 26 and 28 while apertures 74 and 76 are moved to a position vertically below each of the vacuum laminators 26 and 28. For convenience, that initial position of each of the belts 70 and 72 is herein referred to as the "set-point" position of the belt conveyors 22 and 24.

Figure 5:
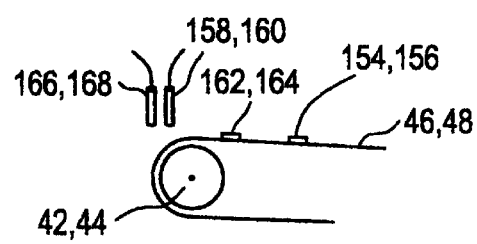

For sensing the set-point position of each of the belt conveyors 22 and 24, there are provided respective cams 154 and 156 that are mounted on each of the endless chains 50 and 52 and cooperating sensors 158 and 160 that may be mounted on the frame 10 of the applicator 12 as illustrated in FIGS. 2 and 5.

In order to provide a signal anticipatory of the approach of each of the belt conveyors 22 and 24 to the set-point position thereby to enable relatively fast operation in the return of the belt conveyors 22 and 24 to the set-point position, there are also provided respective cams 162 and 164 sensors 166 and 168 for slowing down the speed of each belt conveyor 22 and 24 to the set-point position, as illustrated in FIGS. 2 and 5.

For detecting the presence of a processed printed circuit board or substrate at the exit end of the belt conveyors 22 and 24, there are provided respective output photocells 170 and 172, as shown in FIG. 2.

Also, as shown in FIG. 2, an infrared sensor 174 is provided for sensing the temperature of the processed printed circuit board or substrate as it is conveyed out of the second laminator 28. The temperature of the processed printed circuit board or substrate, as sensed by sensor 174 and indicated or displayed by suitable means, facilitates control of the heating means in the second vacuum laminator 28 thereby to preclude overheating thereof and possible damage to the circuit board or substrate being vacuum laminated.

Since the sheets of dry film applied to the prelaminated printed circuit boards being vacuum laminated have high flow characteristics in the temperature range of 30° C. to 150° C., the vacuum lamination process may be carried out within this range.

The vacuum laminators 26 and 28 that advantageously may be used in the conveyorized vacuum laminator 12 are illustrated FIGS. 69. The vacuum laminators 26 and 28 can be provided as part of an integral dual chamber machine, as shown in FIG. 2, or, if desired, as separate vacuum lamination units arranged in end-to-end relation. Each of the vacuum laminators 26 and 28, although shown as being identically constructed, are operated in different modes according to this invention, as described below, in order to perform separate functions in the vacuum lamination process which in combination assure complete conformance of the dry film to the substrate surface.

Referring to FIG. 6 (with the prime (') symbol being used to denote previously unnumbered parts associated with the first laminator 26 and double prime (") being used for those of the second laminator 28), each of the laminators 26 and 28 include an upper stationary platen 150 and 152 and a corresponding movable lower platen 146 and 148, respectively. Associated with each of the upper platens 150 and 152 is a resilient silicon rubber blanket 176', 176' that forms a ceiling for the vacuum chamber region indicated at 178', 178" in FIGS. 6, 8 and 9. Each lower platen 146 and 148 has a well 180', 180" into which a prelaminated printed circuit board or substrate to be vacuum laminated is positioned on a silicon rubber insert 182', 182" for vacuum lamination. Sealing means 184', 184" in the form of an O-ring surrounding the circumference of each of the lower platens 146 and 148 is provided for hermetically sealing the well 180', 180" for the evacuation of air therefrom by a vacuum pump 186', 186" when the respective lower platen 146 and 148 is moved upward into contact with an upper platen 150 and 152. One or more shim inserts 188', 188" may be provided, as shown in FIG. 6, to accommodate printed circuit boards of different thicknesses, that is, for adjusting the printed circuit boards to an optimum position in the well 180', 180" for best vacuum lamination operation.

Both upper and lower platens include heaters, specifically a heater 190', 190" in each of the upper platens 150 and 152 and a heater 192', 192" in each of the lower platens 146 and 148. As described below, the platen heaters may be on or off depending on the desired mode of laminator operation.

Printed circuit boards that have been prelaminated, that is, have, had dry film photoresist or solder mask previously loosely applied to one or both sides thereof, as described hereinbefore, are vacuum laminated in the vacuum laminators 26 and 28 in the following sequence in accordance with the present invention:

(1) The board to be vacuum laminated is first placed in the well 180' of the lower platen 146 of the first vacuum laminator 26 on top of the silicon rubber insert 182'. This is facilitated by relieving the tension, on the first conveyor belt 70 on the surface of which the board has been conveyed to the region of the first vacuum chamber 178'.
(2) The lower platen 148 is then moved upward, as shown in FIG. 8, to seal, by means of the O-ring 184', the well 180' which together with the blanket 176' forms the first vacuum chamber 178'. Note that the belt 70 on which the board being vacuum laminated rests is also captured between the upper platen 150 and the lower platen 146.
(3) With the platen heaters 190' and 192' dormant, the vacuum process cycle is started by the energization of the vacuum pump 186' thereby to evacuate air from the vacuum chamber 178'. During this stage, channels 194' in the upper platen 150 of the first vacuum laminator 26 are closed, so that air is not also evacuated from the region between the upper platen 150 and the blanket 176'. Note that this process step operates at ambient temperature which prevents pretacking of the prelaminated film to the board.
(4) When the first vacuum cycle is complete, the vacuum in the first vacuum chamber 178' is released by allowing atmospheric air to enter therein, whereby the lower platen 146 is moved downward out of contact with the upper platen 150. Tension in the belt 70 is then restored to allow the board to be conveyed to the second vacuum laminating operation.
(5) The board is then moved immediately to the second vacuum laminator 28 and placed in the well 180" of the lower platen 148 thereof on top of the silicon rubber insert 182". Similarly, this is facilitated by relieving the tension on the second conveyor belt 72 on the surface of which the board has been conveyed to the region of the second vacuum chamber 178".
(6) The lower platen 148 of the second vacuum laminator 28, which in this stage is heated, is moved upward, as shown in FIG. 8, to seal, by means of the O-ring 184", the well 180" which together with the blanket 176" forms in the same manner as set forth above the second vacuum chamber 178". Note that the belt 72 on which the board being vacuum laminated rests is also captured between the upper platen 152, which is this stage is heated as well, and the lower platen 148.
(7) The second vacuum process cycle is started by the energization of the vacuum pump 186" thereby to evacuate air from the vacuum chamber 178" and from the region between the upper platen 152 and the blanket 176".
(8) For a set period at the end of a first stage of the second vacuum process cycle, there is a second stage or "slap down" of the blanket 176" in the upper platen 152, as shown in FIG. 9. This is effected by opening channels 194" in the upper platen 152 to allow atmospheric air or compressed air (e.g. 1 to 5 bars) to enter the space between the blanket 176" and the upper platen 152. Such slap down applies mechanical pressure on the printed circuit board to force the now heated film to conform around the raised circuit traces or substrate surface contours. While it is not necessary to pull a vacuum in the second chamber for film evacuation, with this equipment it enables slap down to effectively occur.
(9) When the second vacuum cycle is complete, the vacuum in the second vacuum chamber 178" is released by allowing atmospheric air to enter therein whereby the heated lower platen 148 is moved downward out of contact with the heated upper platen 152. Tension in the belt 70 is then restored to allow the board to be moved to the next operation.

Figure 10:
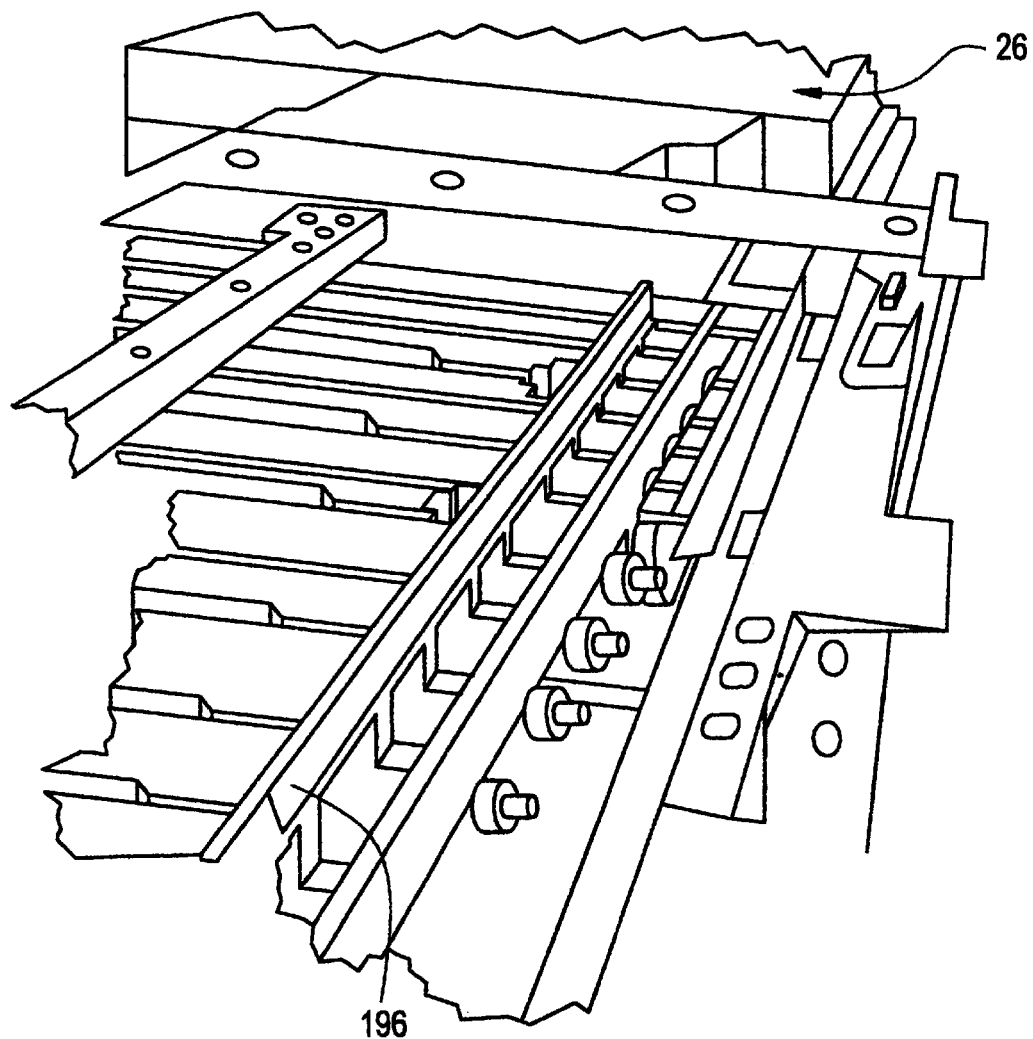

It is noted that, in accord with the invention, the prelaminated boards to be vacuum laminated by the conveyorized vacuum applicator 12 will have been centered by preceding equipment in the in-line system, although, if desired, adjustable guides 196 may be provided for that purpose in association with the input conveyors 14 and 16, as illustrated in FIG. 10.

The function cycle of the improved conveyorized vacuum applicator 12 of the present invention that prevents premature tacking or adhesion of the dry film to the board prior to film evacuation is illustrated by FIGS. 11–24.

In step 1 of the sequence, as shown in FIG. 11, a prelaminated circuit board 200 is shown arriving on the input conveyor 14 from preceding equipment running at a speed of 3 m/min. The movable barrier 30 is in the "up" board blocking position. Being disengaged from the chain drive gearing 84 by clutch 104, the belt conveyor 22 remains stationary.

In step 2 of the sequence, as shown in FIG. 12, the board 200 is stopped at the exit end 14b of the input conveyor 14 by the barrier 30 and is moved into alignment therewith, that is squared up with respect thereto. As noted hereinbefore, the board 200 already has been centered on the conveyor 14, having been centered by preceding equipment or by adjustable guides 196 associated with the input conveyor 14. The first input conveyor 14 is stopped, as by actuation of electromagnetic clutch 92, as soon as the board 200 is sensed at the exit end 14b thereof by the photocell 36.

As controlled by a programmable logic controller (PLC) indicated schematically by the reference numeral 198 in FIG. 2, the barrier 30 is actuated downwardly, by actuation of air cylinder 32 in step 3 of the sequence, as shown in FIG. 13, to release the board 200. Immediately thereafter the input conveyor 14 and the first belt conveyor 22 are both started by appropriate energization of the direct current motor 78 for operation at a speed of 9 m/min to load the board 200 very quickly onto the belt 70 on the first belt conveyor 22 and thereby into the first vacuum chamber of the first vacuum laminator 26.

Figure 14:
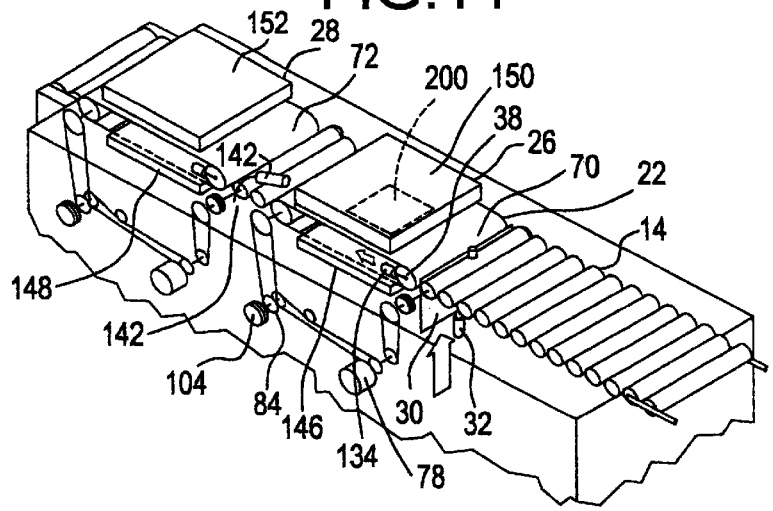

In step 4 of the sequence, as seen in FIG. 14, a cam 138 and cooperating sensor 142 provide a signal to stop the belt conveyor 70 of the first vacuum laminator 26 and the input conveyor 14 when the board 200 is in the first vacuum chamber 178' at a position directly vertically above the well 180 in the lower platen 146. The barrier 30 is moved up by actuation of air cylinder 32 and the input roll 38 of the belt conveyor 22 is shifted by the actuation of the two-position air cylinder 134 in the direction of the first vacuum chamber in order to release the tension of the belt 70. The input conveyor 14 starts to run at a speed of 3 m/min. Being disengaged from the chain drive gearing 84 by the electromagnetic clutch 104, the first belt conveyor 22 remains stationary.

Figure 15:
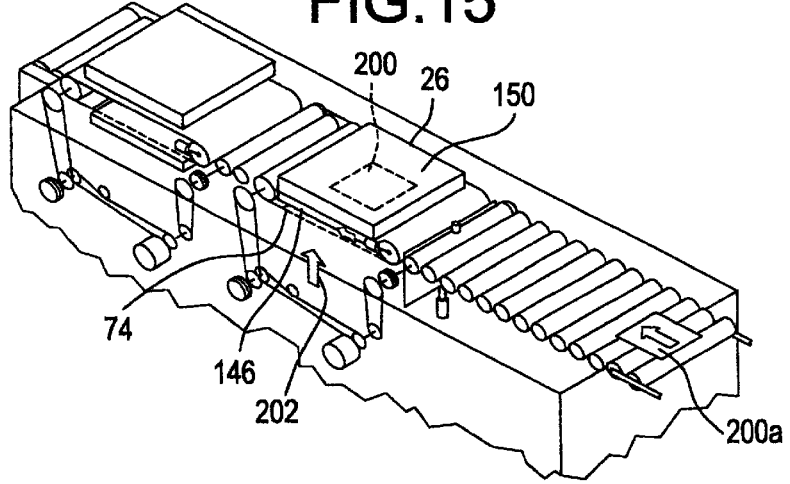

As seen in FIG. 15, in step 5 of the sequence, the lower platen 146 of the first laminator 26 is moved vertically upward by a pneumatic ram 202. The lower platen 146 passes upward through the aperture 74 in the belt 70, which aperture 74 is then in vertical alignment with the lower platen 146. Vacuum pump 186' is actuated for a predetermined time in a first stage of the vacuum process at ambient temperature conditions. Accordingly, at no time during this phase is the vacuum chamber heated by the platen heaters 190' and 192', the heaters remaining dormant. Meanwhile, a new prelaminated board 200a to be vacuum laminated has arrived on the input conveyor 14 and is moved to and is stopped at the barrier 30, which, as shown in FIG. 15, is in the up position.

Figure 16:
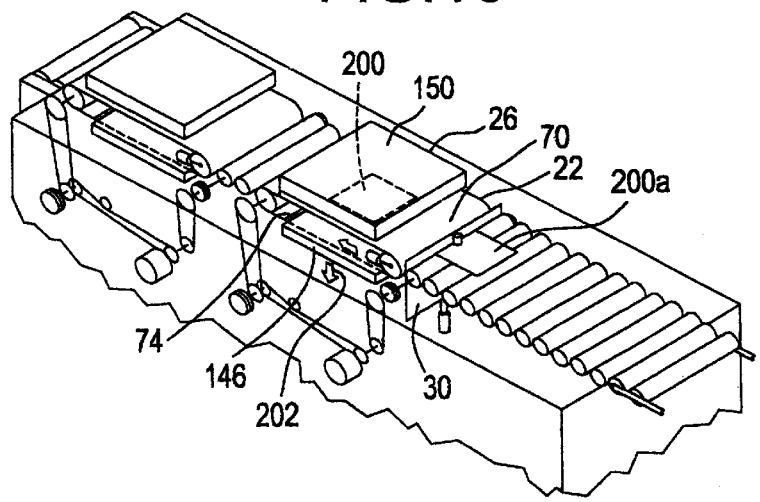

Step 6 of the sequence is shown in FIG. 16. This is after the first stage of the vacuum process has been completed. The vacuum in the first vacuum chamber is released by actuating a valve to allow the introduction of atmospheric air into the vacuum chamber 178'. The lower platen 146 is then lowered by the hydraulic cylinder 202 down through the aperture 74 in the belt 70 of the first belt conveyor 22.

Meanwhile, the new board 200a is aligned or squared up on barrier 30 and the first input conveyor 14 is stopped.

Figure 17:
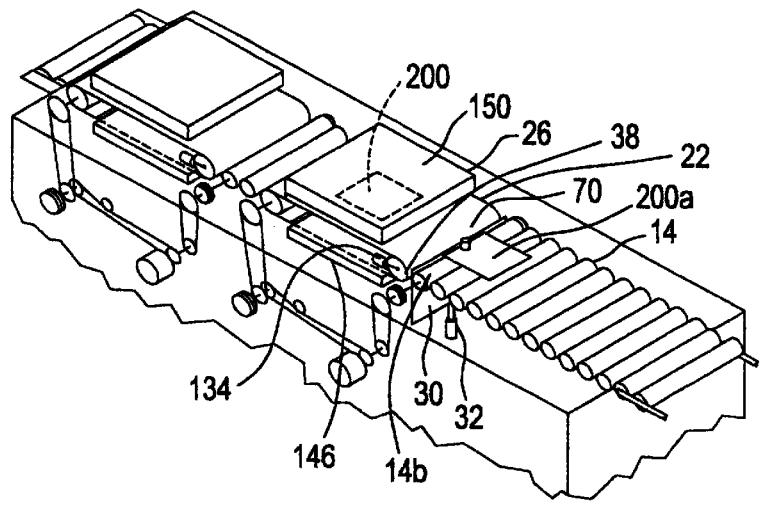

In FIG. 17, which shows step 7 of the sequence, the input belt roll 38 is moved back toward the exit end 14b of input conveyor 14 by the two-position air cylinder 134 to restore the tension of the belt 70 of the first belt conveyor 22. The new board 200a is waiting in aligned position at the barrier 30 on the input conveyor 14.

Figure 18:
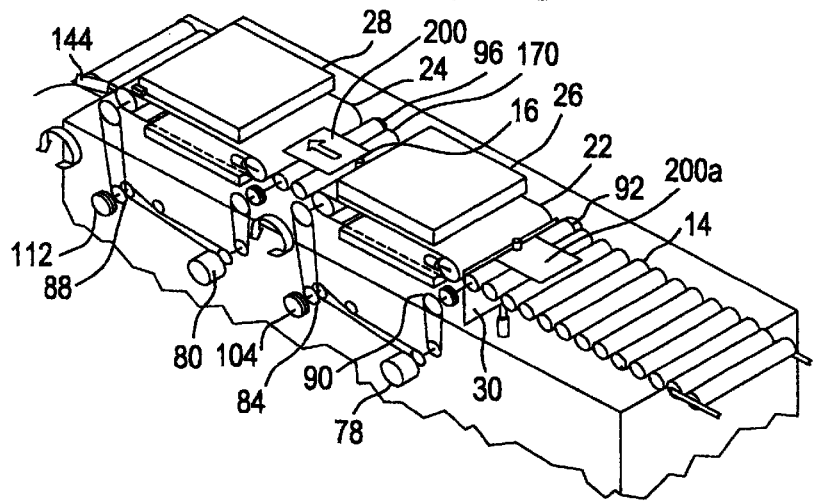

As shown in FIG. 18, which shows step 8 of the sequence, the actuation of the electromagnetic clutches 96, 104 and 112 is such that the belt conveyors 22 and 24 of both laminators 26 and 28 start running along with input conveyor 16. Being disengaged from the chain drive gearing 90 by clutch 92, the first input conveyor 14 remains stationary. The simultaneous energization of both motors 78 and 80 as controlled by the PLC 198 is then such that both belt conveyors 22 and 24 and input conveyor 16 start at a speed of 9 m/min to effect a rapid unloading and loading of the partially processed board 200 from the vacuum chamber of the first vacuum laminator 26 into the vacuum chamber of the second vacuum laminator 28. A cam 140 and cooperating sensor 144 provide a signal to stop the belt conveyor 72 and input conveyor 16 when the board 200 is in the second vacuum chamber at a position directly above the well in the lower platen 148.

Figure 19:
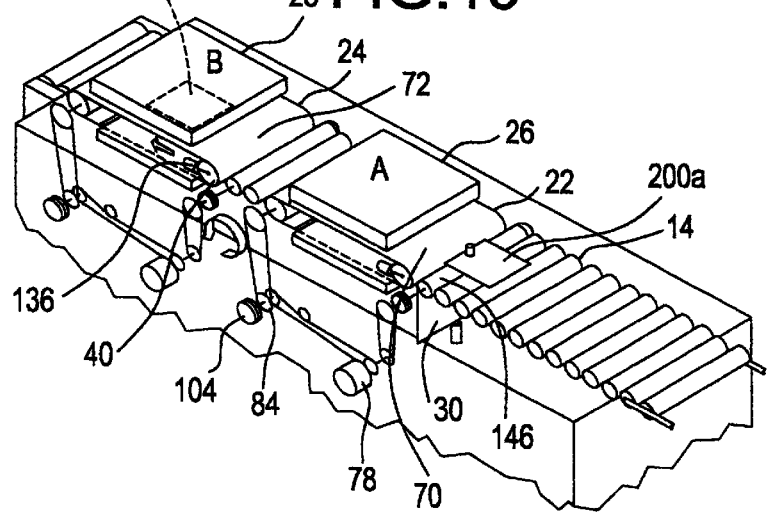

In step 9 of the sequence, shown in FIG. 19, as soon as the partially processed board 200 is completely off the first belt 70, as sensed by the photocell 170, the speed of the belt conveyor 70 is increased to 30 m/min in order to move the belt 70 quickly to the set point and to load the new board 200a that has been waiting at the exit end 14b of input conveyor 14. A few centimeters before the set point is reached the speed of the belt conveyor 22 is slowed down to 3 m/min and then the belt conveyor 22 is stopped precisely at the set point. Meanwhile, with the partially processed board 200 having been introduced in the second vacuum chamber 178", the input roll 40 of the second belt conveyor 24 is shifted by the actuation of the two-position air cylinder 136 in the direction of the second vacuum chamber in order to release the tension of the belt 72.

Figure 20:
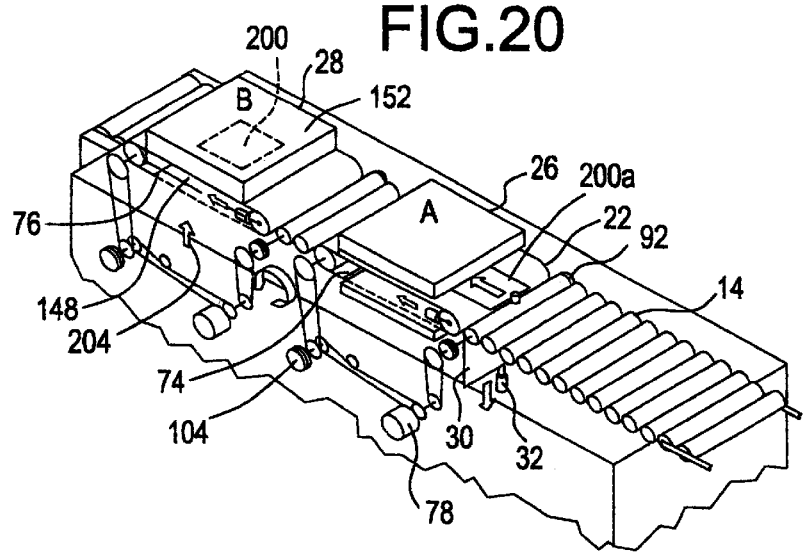

In step 10 of the sequence, as shown in FIG. 20, the lower platen 148 of the second vacuum laminator 28 is moved vertically upward by a pneumatic ram 204. The platen 148 passes upward through the aperture 76 in the belt 72, which aperture 76 is then in vertical alignment with the lower platen 148. Vacuum pump 186" is actuated for a predetermined time in a first stage of the second vacuum process, after which, for a short period of time, a slap down action, as described in connection with FIG. 9, is applied. During the vacuum phase the board 200 is heated by the heaters 190" and 192" in the upper and lower platens 152 and 148, respectively. It should be understood that during the second vacuum process, vacuum is applied not to draw-off air between the film and the surface at the board 200, as this has already been accomplished in the first stage of the two stage operation, but to create a good situation to apply mechanical pressure to the board 200 by slap down action. Meanwhile, the barrier 30 is actuated downwardly, by actuation of air cylinder 32 to release the new prelaminated board 200a awaiting at the entrance of the first vacuum laminator 26. Immediately thereafter the input conveyor 14 and the first belt conveyor 22 are both started by appropriate engagement of electromagnetic clutches 92 and 104 and energization of the motor 78 for operation at a speed of 9 m/min to load the new board 200a onto the belt 70 on the first belt conveyor 22 and thereby into the first vacuum chamber. Cam 138 and cooperating sensor 142 provide a signal to stop the belt conveyor 22 after the board 200a has moved to the proper position in the first vacuum chamber.

Figure 21:
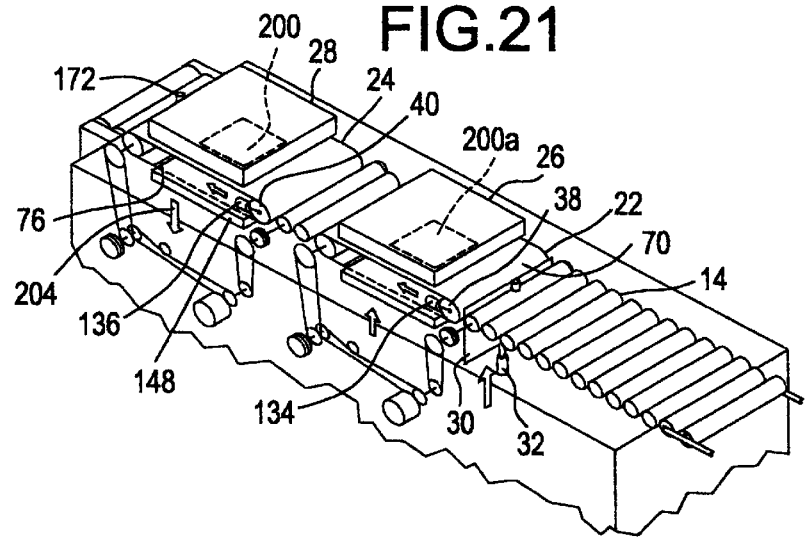

Step 11 of the sequence is shown in FIG. 21. This is after the final stage of the vacuum lamination process has been completed. The vacuum in the second vacuum chamber 178" is released by actuating a value to allow the introduction of atmospheric air into the vacuum chamber. The lower platen 148 is then lowered by the hydraulic cylinder down through the aperture in the belt 76 of the second belt conveyor 24. While at the same time, the barrier 30 is moved up by actuation of the air cylinder 32 and the input roll of the first belt conveyor 22 is shifted by actuation of the air cylinder 134 in the direction of the vacuum chamber in order to release tension of the belt 70. The input conveyor 14 then starts to run at a speed of a 3 m/min, to receive a new prelaminated board while the belt 70 remains stationary.

Figure 22:
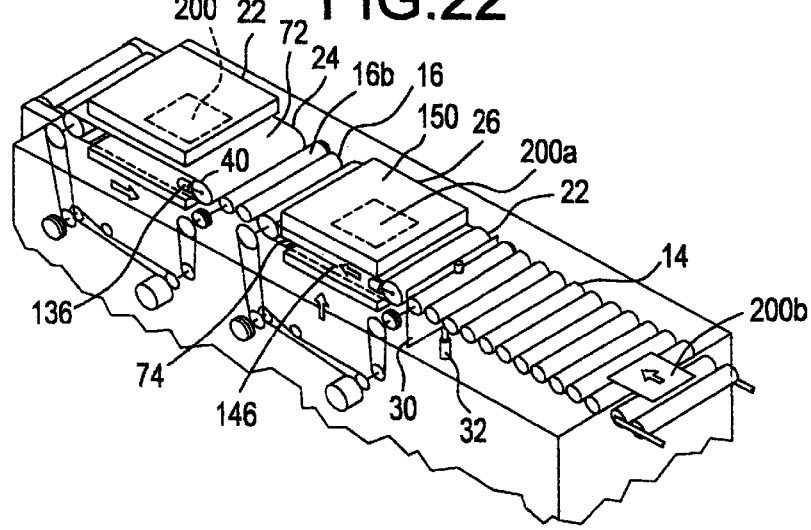

As seen in FIG. 22, in step 12 of the sequence, the input roll 40 is moved back toward the exit end 16b of input conveyor 16 by the two-position air cylinder 136 to restore the tension of the belt 72 of the second belt conveyor 24. While at the same time, the lower platen 146 of the first laminator is moved vertically upward through the aperture 74 in the belt 70. Ambient evacuation occurs in the same manner as set forth in step 5. Meanwhile, a new prelaminated board 200b is arriving on the first input conveyor 14.

Figure 23:
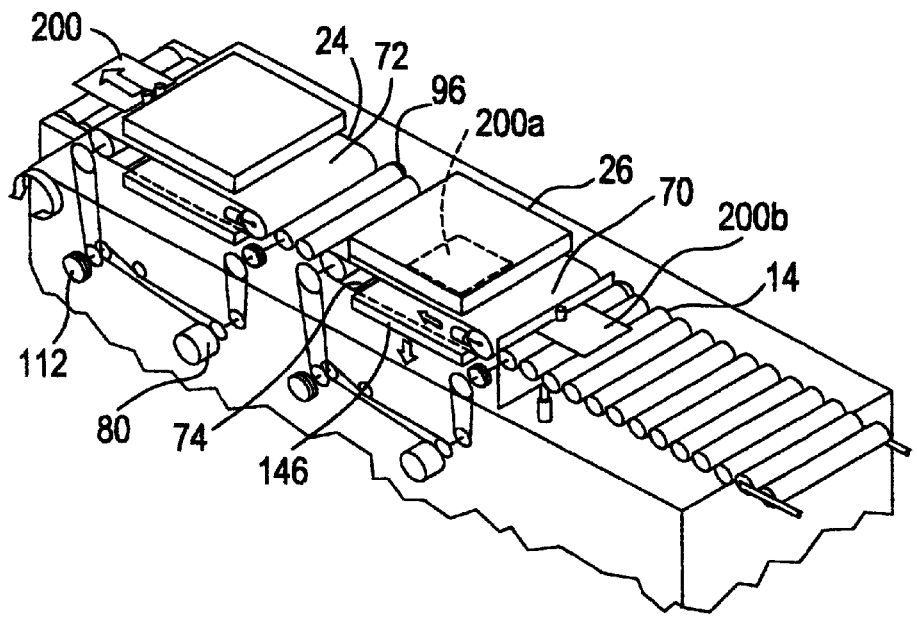

In step 13, as shown in FIG. 23, the actuation of the electromagnetic clutches 96 and 112 is such that the second belt conveyor 24 only starts. The energization of the motor 80 as controlled by the PLC is then such that the second belt conveyor 24 starts at a speed of 9 m/min to effect a rapid unloading of the processed board 200. Meanwhile, the ambient vacuum process in the first vacuum chamber is now complete. The vacuum in the first chamber 178' is therefore released by actuating a value to allow introduction of atmospheric air into the vacuum chamber. The lower platen 146 is then lowered by the hydraulic cylinder down through the aperture 74 in the belt 70. The new board 200b is aligned or squared upon the barrier 30 and the input conveyor 14 is stopped.

In step 14 of the sequence, shown in FIG. 24, as soon as the processed board is completely off the second belt 72, as sensed by photocell 172, the speed of the second belt conveyor 24 is increased to 30 m/min in order to move the belt 72 quickly to the set point to accept the new board 200a. The temperature of the processed board 200 is read by infrared sensor 174 as it leaves the second vacuum laminator 28 as well. While at the same time, the input roll 38 of the first belt conveyor 22 is moved back toward the exit end 146 of the first input conveyor 14 by the two position air cylinder 134 to restore the tension of the belt 70 of the first belt conveyor 22. The next new board 200b awaits in aligned position at the barrier 30 on the input conveyor 14. The cycle then repeats from step 8 illustrated in FIG. 18.

The sensing switches comprising cams 138, 140, 154, 156, 162 and 164 and cooperating sensors 142, 144, 158, 160, 166 and 168 respectively, may each be of the type known in the art as proximity switches, a non-contacting switch. More specifically, the cam may comprise a metallic object with the sensor, in each case, comprising an electronic device which is fixed in position and is responsive to the movement nearby of the metallic cam and is operative to generate an electrical signal in response to movement and hence sensing of the metallic object.

The programmable logic controller 198 utilized to control the sequential operation of the conveyorized vacuum applicator 12 may be a microprocessor controller of a type available commercially from Saia, Mitsubishi or others. The controller 198 responds to the various signals produced by the photocells 36, 170 and 172 and by the proximity switch sensors 142, 144, 158, 160, 166 and 168 to initiate, in concert with preprogrammed control data the several ensuing control functions including timing of the vacuum process laminating stages. These control functions include the actuation in the proper sequence of the air cylinders 32, 134 and 136, the pneumatic rams 202 and 204, and the electromagnetic clutches 92, 96, 104 and 112 and the selector switches 126 and 128 for the motor speed control potentiometers 114, 116 and 118 and 120, 122 and 124 respectively. For convenience of illustration, in FIG. 2 the control paths between the PLC 198 and the several control devices just mentioned have been shown in dotted lines. It will be understood that, although not shown, the dotted lines include, where necessary and appropriate, as well known to those skilled in the art, conversion devices such as electrically operated pneumatic valves to control the various air cylinders and the pneumatic ram, and electrical relay means to control the motor speed control selector switches. The electrical circuit connections to the several input terminals (not shown) of the PLC 198 from the photocells and from the sensors have not been shown in order to avoid complication of the drawing since such circuitry is well known and understood by those skilled in the art.

Referring to FIG. 25, in an alternative embodiment, the second vacuum laminator 28 may contain a dual belt system to further insulate the evacuated board from the heated upper and lower platens. This dual belt system is more fully described in copending Italian application filed on the same day herewith by the same Applicant under the same title, the disclosure of which application, by reference, is incorporated herein. The essential feature of the dual belt vacuum laminator shown in FIG. 25 is the provision of two independent (i.e., dual) belt conveyor systems, specially a lower belt conveyor 206 and an upper belt conveyor 208. The lower belt conveyor 206 is positioned for movement of the prelaminated board into and out of the vacuum chamber of the second laminator 28 for application of heat and mechanical pressure. The lower belt conveyor comprises an endless belt with two distinct sections 210 and 212 upon which the board can be placed spaced apart by two apertures 214 and 216. The two sections are so positioned such that, when one section of the lower belt is moved with the board into the vacuum chamber region, the other section is moved out of said region for cooling and vice versa. The upper belt conveyor 208 is spaced above the lower belt conveyor in the vacuum chamber region and also comprises an endless belt 218 with at least two distinct sections that alternate into and out of the vacuum chamber region such that, when one section of the upper belt is moved into the vacuum chamber region, at least one other section is moved out of said region for cooling and vice versa. In operation, as one section (i.e., a cool section) of the lower belt moves with the board to be vacuum laminated into the vacuum chamber region, one section (i.e., a cool section) of the upper belt is also indexed into the vacuum chamber region, as the other belt sections are moved out of the vacuum chamber region for ambient cooling. This enables the board being vacuum laminated to be disposed initially only between cool sections of the upper and lower belts, which act as heat shields to prevent the dry film from heating up too fast and prematurely adhering to the board, when exposed to residual heat given off by the heat platens which are still hot from a previous vacuum lamination cycle.

What is claimed is:

1. A method of vacuum laminating a dry film photoresist-forming layer onto a prelaminated printed circuit board or other substrate (200) which prevents premature tacking of the dry film to the board or substrate, comprising:

(a) placing the board or substrate in a first vacuum lamination chamber of a vacuum laminator (12) having two independent vacuum lamination chambers (18,20);

(b) drawing a vacuum in said first chamber (18) at ambient temperature for a time sufficient to evacuate substantially all of the air from between the dry film and the surface of the board or substrate and place the dry film in intimate contact with the surface of the board substrate;

(c) placing the board or substrate in a second vacuum lamination chamber (20) of the vacuum laminator, said second chamber being independent of said first chamber; and, (d) applying sufficient heat to the dry film on the board or substrate in said second chamber (20) to cause the dry film to adequately flow, the sufficient heat is at a temperature range of from 30° C. to 150° C., and then sufficient mechanical pressure on the board or substrate to thereby force the heated laminate to conform closely to the surface contours of the board or substrate.

2. A method according to claim 1 wherein steps (a)–(d) are operated in-line.

3. A method according to claim 2 wherein steps (a)–(d) are operated in a continuous automated fashion.

4. A method according to claim 3 wherein steps (b) and (d) are operated in alternating sequence to allow at least one prelaminated board or substrate to be in each vacuum chamber at the same time.

5. A method according to claim 3 comprising in an automatic sequential operation:

(a) placing a first board or substrate (200a) on the entrance end of a first moving belt conveyor (22) for movement into the first vacuum lamination chamber (18), the first chamber being defined by an upper platen (150) and a lower platen (146) adapted to be moved into sealing engagement, the first belt conveyor having an endless belt (70) under tension that has an aperture (74) therein and is characterized by having an initial or set-point position such that, as the board or substrate is moved on the endless belt into the region of the first vacuum chamber between the upper and lower platens, the aperture is moved into alignment with and between the board and the lower platen;

(b) sensing the positioning of the board in the first vacuum chamber (18) of the vacuum laminator and stopping the movement of the first belt conveyor (22);

(c) relieving the tension on the endless belt (70) of the first belt conveyor;

(d) lifting the lower platen (146) up through the aperture (74) in the endless belt into sealing engagement with the upper platen (150) and thereby capturing within the first vacuum chamber (18) the board or substrate (200) and at least the portion of the endless belt upon which the board or substrate is positioned;

(e) evacuating the first vacuum chamber (18) at ambient temperature for a time sufficient to draw off all of the air between the loosely applied prelaminated dry film and the surface of the board or substrate, thereby to place the dry film in intimate contact with the board or substrate surface;

(f) when the aforesaid evacuation is complete, allowing atmospheric air to enter the first vacuum chamber (18);

(g) lowering the lower platen (146) down through the aperture (74) in the endless belt (70);

(h) restoring the tension in the endless belt (70) for movement of the evacuated board or substrate out of the first vacuum chamber (18);

(i) conveying the board or substrate (200a) out of the first vacuum chamber (18) and to the entrance end of a second moving belt conveyor (24) for movement into a second vacuum lamination chamber (20) of the vacuum laminator, said second chamber being arranged in-line with said first chamber (18), said second chamber being defined by an upper platen (152) and a lower platen (148) adapted to be moved into sealing engagement, the second belt conveyor having an endless belt (72) under tension that has an aperture (76) therein and is characterized in having an initial or set-point position such that, as the board is moved on the endless belt into the region of the second vacuum chamber between the upper and lower platens, the aperture is moved into alignment with and between the board and the lower platen (148);

(j) continuing the movement of the first endless belt (70) to the initial or set-point position for acceptance of a new prelaminated board or substrate arriving at the entrance end of the first vacuum chamber (18);

(k) sensing the positioning of the evacuated board or substrate (200a) in the second vacuum chamber (20) and stopping the movement of the second belt conveyor (24);

(l) relieving the tension on the endless belt (72) of the second belt conveyor (74);

(m) lifting the lower platen (148) in the second vacuum chamber up through the aperture (76) in the endless belt (72) into sealing engagement with the upper platen (152) and thereby capturing within the second vacuum chamber the board or substrate and the portion at least of the endless belt upon which the board or substrate is positioned;

(n) evacuating the second vacuum chamber (20);

(o) heating the upper platen (152) and the lower platen (148) of the second vacuum chamber to a temperature at which the laminate on the board or substrate has a high flow characteristic;

(p) causing the upper platen (152) to apply mechanical pressure on the board or substrate to force the heated laminate to conform closely to the surface contours of the board or substrate;

(q) when the aforesaid lamination is complete, allowing atmospheric air to enter the second vacuum chamber (20);

(r) lowering the lower platen (148) of the second vacuum chamber down through the aperture (76) in, the endless belt (72) of the second belt conveyor (24);

(s) restoring the tension in the endless belt (22) of the second belt conveyor for movement of the laminated board or substrate out of the vacuum laminator (12);

(t) conveying the board or substrate out of the vacuum laminator; and, (u) continuing the movement of the second endless belt (72) to the initial or set-point position for acceptance of a new board or substrate exiting from the first vacuum chamber (18) and arriving at the entrance end of the second vacuum chamber (20).

6. A method according to claim 5 further including:

(v) placing on the entrance end of the first conveyor belt (70) a second prelaminated printed circuit board or other substrate (200b); and, (w) repeating steps (a) through (u).

7. A method according to claim 6 wherein in (v) the second prelaminated board or substrate (200b) is placed on the entrance end of the first conveyor belt (70) substantially at the same time step (m) is occurring with respect to the first board or substrate, to enable the vacuum lamination cycle in each vacuum chamber (18,20) to be operated in alternating sequence, thereby allowing at least one prelaminated board to be in each chamber at the same time.

8. A method according to claim 5 further including the following steps, before step (a):

(a.i) conveying on a first input conveyor (14) a prelaminated board or substrate (200a) from preceding equipment towards the first belt conveyor (22);

(a.ii) providing a barrier (30) at the exit end of the first input conveyor (14) to stop the movement of the board or substrate and to align the board or substrate;

(a.iii) sensing the presence of the board or substrate at the exit end of the first input conveyor (14) and stopping the movement of the first input conveyor;

(a.iv) adjusting the barrier (30) at the exit end of the first input conveyor to a non-stopping or non-blocking position; and, (a.v) conveying the board from the first input conveyor to the entrance end of the first belt (70) for movement of the board or substrate into the first vacuum chamber.

9. A method according to claim 1, wherein the dry film is a soldermask or a primary imaging photoresist.

* * * * *